(12) United States Patent
Wu et al.

(10) Patent No.: US 8,530,306 B2
(45) Date of Patent: Sep. 10, 2013

(54) METHOD OF FORMING A SLIT RECESS CHANNEL GATE

(75) Inventors: Tieh-Chiang Wu, Taoyuan County (TW); Yi-Nan Chen, Taipei (TW); Hsien-Wen Liu, Taoyuan County (TW)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 217 days.

(21) Appl. No.: 13/117,162

(22) Filed: May 27, 2011

(65) Prior Publication Data
US 2012/0299185 A1 Nov. 29, 2012

(51) Int. Cl.
*H01L 21/336* (2006.01)
*H01L 29/66* (2006.01)

(52) U.S. Cl.
USPC ........... 438/259; 438/270; 438/589; 257/330; 257/397; 257/751; 257/E29.158; 257/E21.19; 257/E21.41; 257/E21.629

(58) Field of Classification Search
None
See application file for complete search history.

(56) References Cited

U.S. PATENT DOCUMENTS

| | | | | |
|---|---|---|---|---|
| 6,358,800 B1 * | 3/2002 | Tseng | | 438/268 |
| 7,611,949 B2 * | 11/2009 | Chang et al. | | 438/272 |
| 8,236,651 B2 * | 8/2012 | Chen et al. | | 438/270 |
| 2008/0305593 A1 * | 12/2008 | Hsiao et al. | | 438/261 |
| 2009/0173994 A1 * | 7/2009 | Min et al. | | 257/330 |
| 2012/0009772 A1 * | 1/2012 | Mathew et al. | | 438/589 |

* cited by examiner

*Primary Examiner* — Alonzo Chambliss
(74) *Attorney, Agent, or Firm* — Winston Hsu; Scott Margo

(57) ABSTRACT

A slit recess channel gate is further provided. The slit recess channel gate includes a substrate, a gate dielectric layer, a first conductive layer and a second conductive layer. The substrate has a first trench. The gate dielectric layer is disposed on a surface of the first trench and the first conductive layer is embedded in the first trench. The second conductive layer is disposed on the first conductive layer and aligned with the first conductive layer above the main surface, wherein a bottom surface area of the second conductive layer is substantially smaller than a top surface area of the second conductive layer. The present invention also provides a method of forming the slit recess channel gate.

11 Claims, 9 Drawing Sheets

METHOD OF FORMING A SLIT RECESS CHANNEL GATE

BACKGROUND OF THE INVENTION

1. Field of the Invention

The present invention relates to a slit recess channel gate and a method of forming the same, and more particularly, to a slit recess channel gate having a tapered gate conductor and the method of forming the same.

2. Description of the Prior Art

With continuing shrinkage of device feature size, the so-called short channel effect (SCE) due to shrunk gate channel length has been found hindering the integrity of integrated circuit chips. Many efforts have been made for solving this problem, for example, by reducing the thickness of the gate oxide dielectric or by increasing the doping concentration of source/drain. However, these approaches adversely affect the device reliability and speed of data transfer on the other hand, and are thus impractical.

A newly developed recessed-gate MOS transistor becomes most promising. In the filed of Dynamic Random Access Memory (DRAM), the recessed-gate technology may be used to improve the integrity of the memory chip. Typically, the recess-gate MOS transistor has a gate insulation layer formed on sidewalls and bottom surface of a recess etched into a substrate, a conductive filling the recess, contrary to a planar gate type transistor having a gate electrode formed on a planar surface of a substrate.

However, some problems have been met when constructing the recess-gate MOS transistor. For example, in order to form the recess gate MOS transistor, a first lithographic and etching process is first performed to etch a gate trench into the semiconductor substrate. After filling the gate trench with a gate material layer, a second lithographic and etching process is performed to define a gate conductor (GC) on the recess gate. The misalignment between the GC and the recess gate of the recess-gate MOS transistor device is easy to occur, thereby affecting the yield of the devices.

SUMMARY OF THE INVENTION

The present invention therefore provides a slit recess gate structure and the method of forming the same, wherein the gate conductor can align with the recess gate precisely.

According to the claimed invention, a method of forming a slit recess gate is provided. First, a substrate having an array region and a peripheral region is provided. A first trench is formed in the array region. Then, a gate dielectric layer and a first conductive layer are formed on the substrate to at least fill the first trench. Next, a second trench is formed in the first conductive layer in the array region, wherein the second trench is aligned with the first trench. Subsequent, a spacer is formed on a sidewall of the second trench. Lastly, a second conductive layer is formed in the second trench.

According to the claimed invention, a slit recess channel gate is further provided. The slit recess channel gate includes a substrate, a gate dielectric layer, a first conductive layer and a second conductive layer. The substrate has a first trench. The gate dielectric layer is disposed on a surface of the first trench and the first conductive layer is embedded in the first trench. The second conductive layer is disposed on the first conductive layer and aligned with the first conductive layer above the main surface, wherein a bottom surface area of the second conductive layer is substantially smaller than a top surface area of the second conductive layer.

The second conductive layer (the gate conductor) and the spacer, both of which include tapered structures, are proposed in the present invention to ameliorate conventional recess gate which has serious misalignment problem between the recess gate (the first conductive layer) and the gate conductor (the second conductive layer).

These and other objectives of the present invention will no doubt become obvious to those of ordinary skill in the art after reading the following detailed description of the preferred embodiment that is illustrated in the various figures and drawings.

DETAILED DESCRIPTION

For those skilled in the art to understand this invention, numerous embodiments are described below annexing drawings to minutely illustrate the matters of the invention and the purpose thereof.

Figure 1:
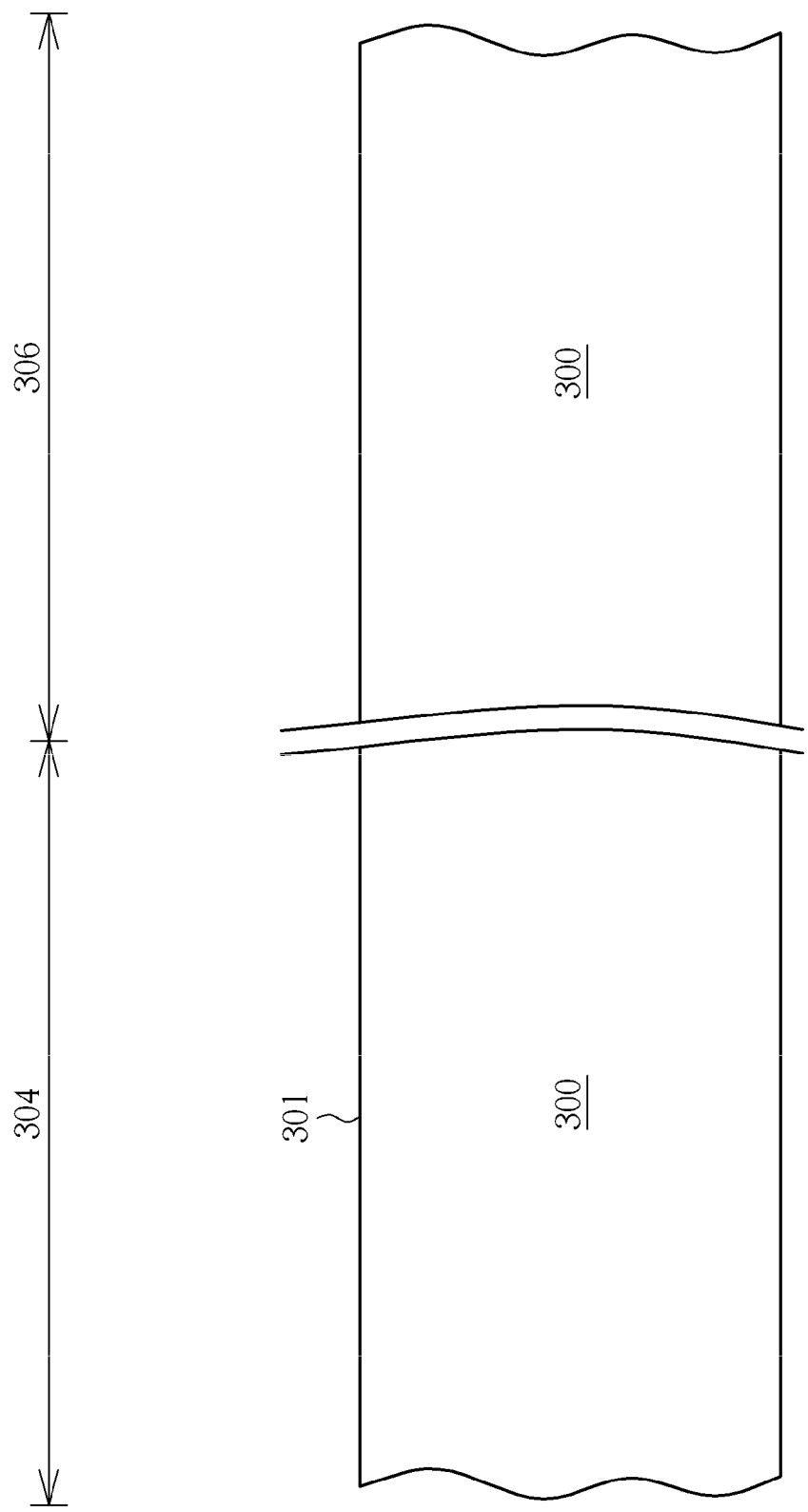
FIG. 1 to FIG. 9 illustrate schematic diagrams of the method of forming the slit recess channel gate in the present invention.

Please refer to FIG. 1 to FIG. 9, illustrating schematic diagrams of the method of forming the slit recess channel gate in the present invention. As shown in FIG. 1, a substrate 300 is provided. The substrate 300 may be a silicon substrate, a silicon epitaxital substrate or a silicon-on-insulator (SOI) substrate. In one embodiment, the substrate 300 has a main surface 301, and an array region 304 and a peripheral region 306 are defined thereon. In the subsequent steps, a slit recess channel gate will be formed in the array region 304 and a peripheral gate will be formed in the peripheral region 306.

Figure 2:
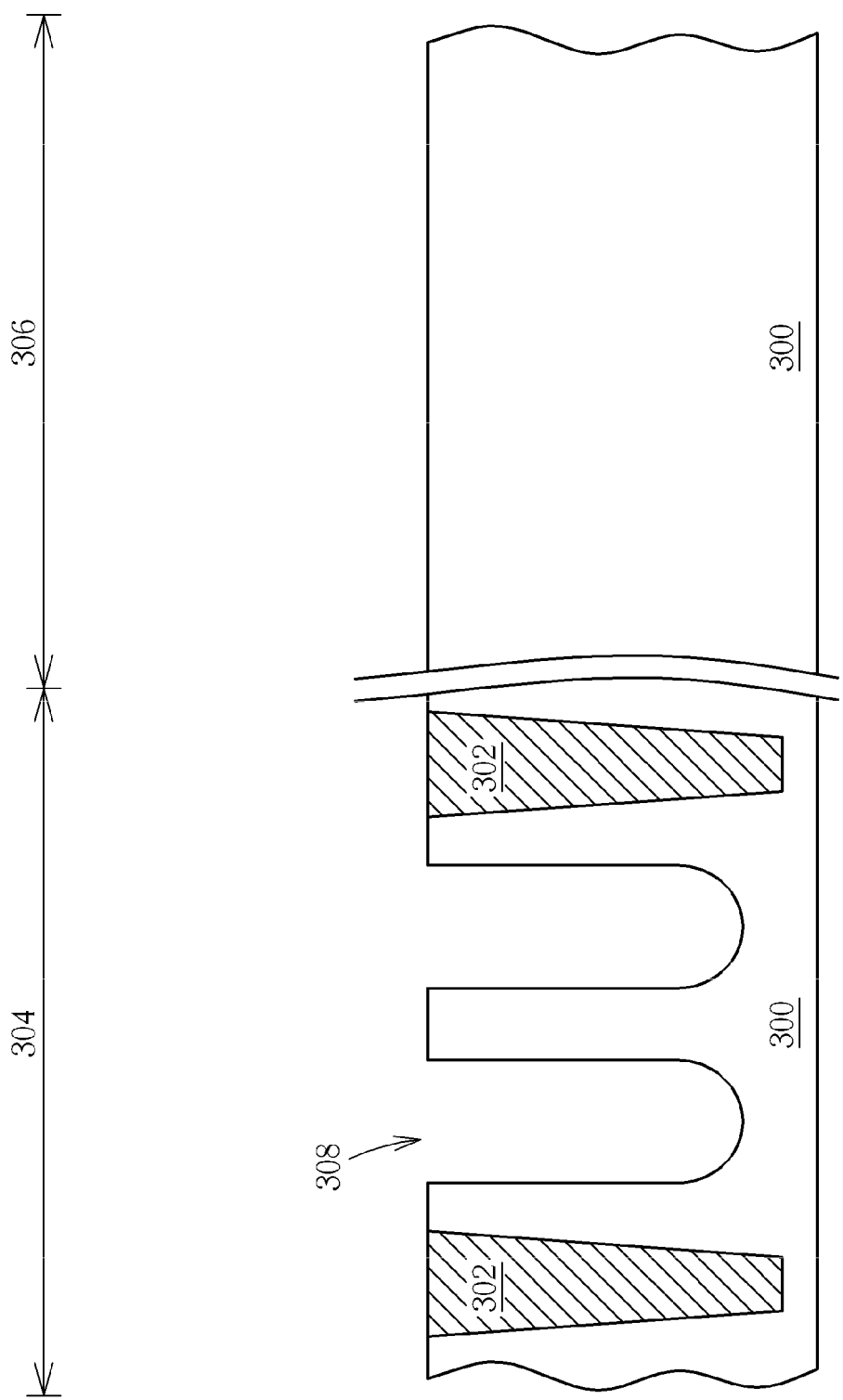

As shown in FIG. 2, a plurality of shallow trench isolations (STI) 302 are formed in the array region 304 of the substrate 300. Next, at least a first trench 308 is formed in the array region 304 on the substrate 300. For example, a photoresist layer (not shown) is formed on the substrate 300, and a lithography process is carried out to form corresponding openings in the photoresist layer. An etching process is then performed by using the photoresist layer as a mask to form the first trenches 308 in the array region 304. Meanwhile, in the peripheral region 306, the substrate 300 is covered and masked by the photoresist layer, and no corresponding structure is formed in the peripheral region 306.

Figure 3:
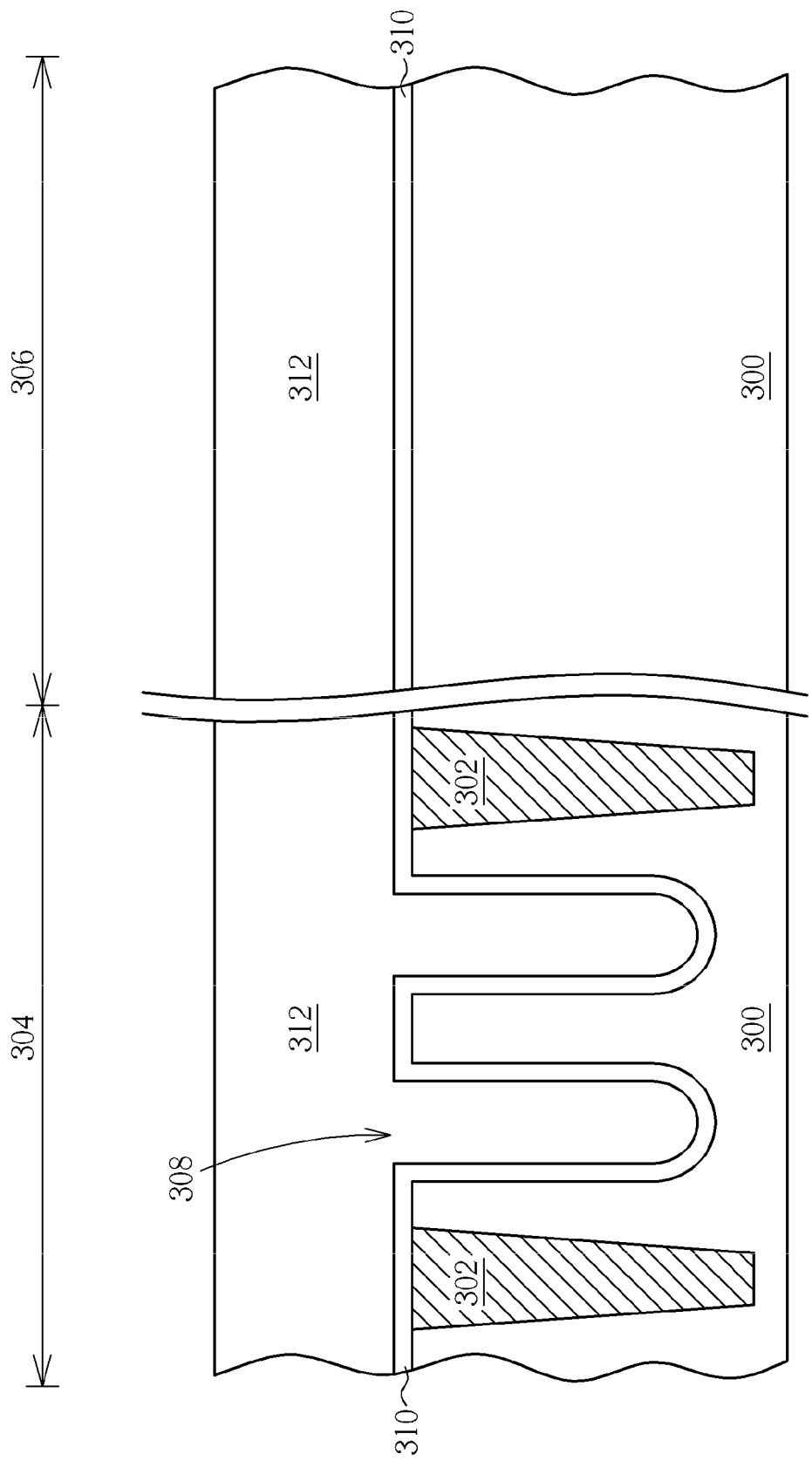

As shown in FIG. 3, a gate dielectric layer 310 is formed on substrate 300 to at least cover the surface of the first trench 310. In one embodiment, the gate dielectric layer 310 can be formed by a deposition process such as a chemical vapor deposition (CVD), a physical vapor deposition (PVD), or an oxidation process such as an in-situ steam growth process (ISSG). Next, a first conductive layer 312 is formed on the gate dielectric layer 310 to completely fill the first trenches 308. In one preferred embodiment, the first conductive layer 312 includes poly-silicon.

Figure 4:
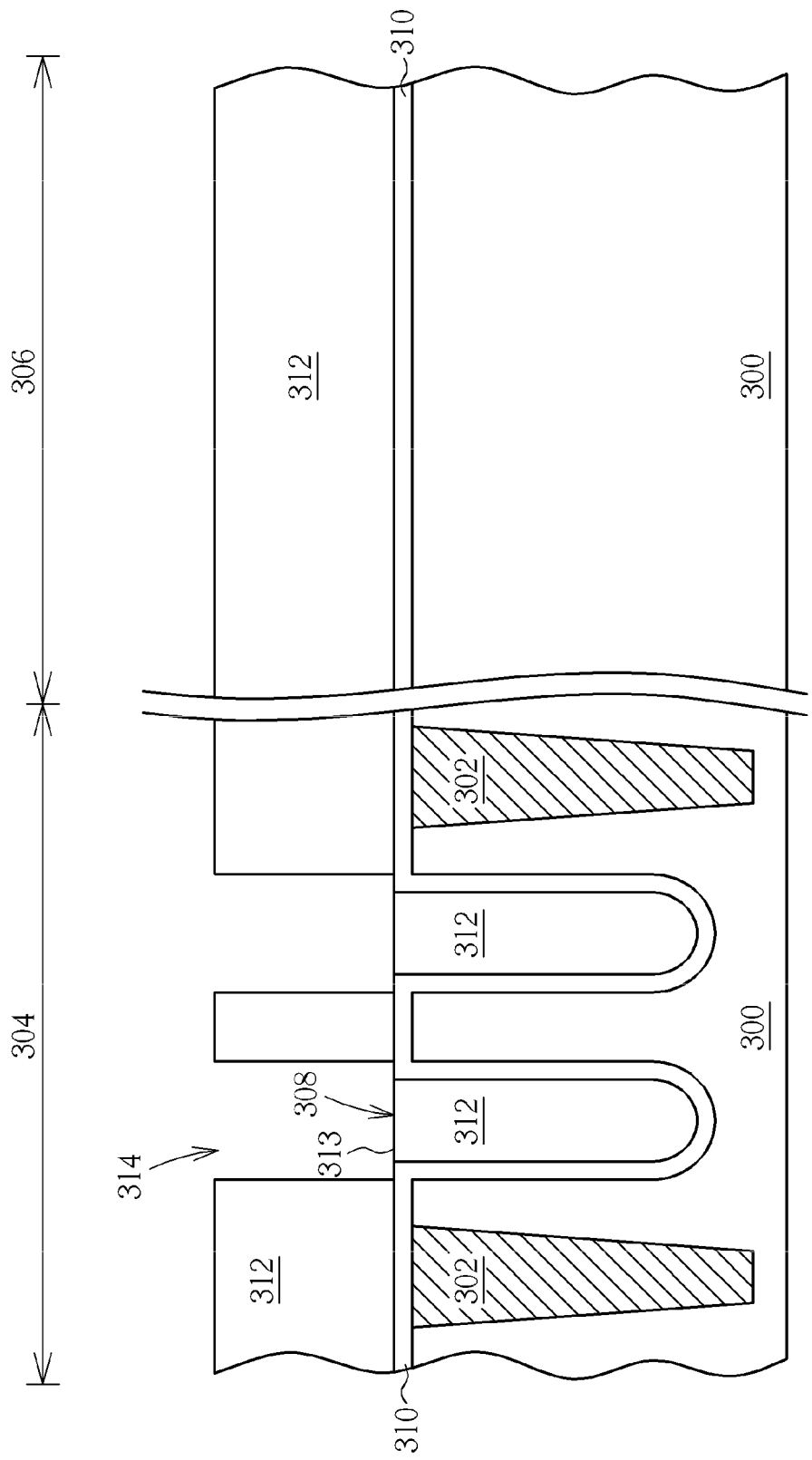

As shown in FIG. 4, at least a second trench 314 is formed in the first conductive layer 312 in the array region 304. Each second trench 314 is aligned with the first trench 308 to expose a top surface area 313 of the first conductive layer 312 in the first trench 308. In one preferred embodiment, the bottom surface of the second trench 314 is equal or slightly larger than the top surface area 313 of the first conductive layer 312 in the first trench 308. Similarly, when forming the second trenches 314, the substrate 300 in the peripheral region 306 is masked and no corresponding structure is formed in the first conductive layer 312 in the peripheral region 306.

Figure 5:
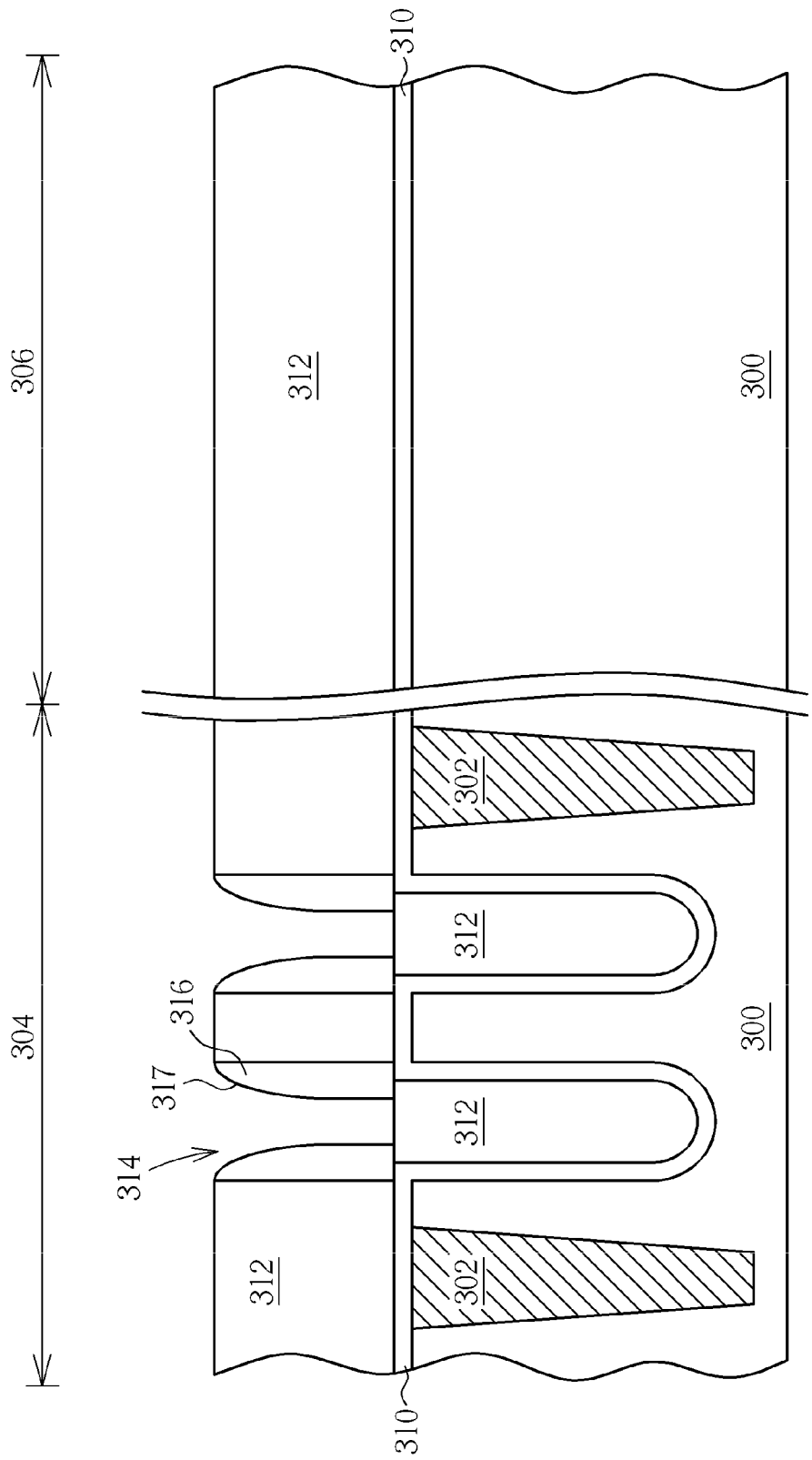

Next, as shown in FIG. 5, a spacer 316 having a curved surface 317 is formed on a sidewall of the second trench 314. For example, a silicon nitride layer (not shown) is deposited on the substrate 300. An etching process, preferably an anisotropic dry etching process, is carried out to form the spacer 316. It is noteworthy that the curved surface 317 of the spacer 316 faces inwardly into the center of the second trench 314, thereby forming a tapered structure shrinking from bottom to top. As shown in FIG. 5, a part of the top surface area 313 of the first conductive layer 312 (the peripheral part) is covered by the spacer 316 while the other part (the central part) of the top surface are 313 is exposed.

Figure 6:
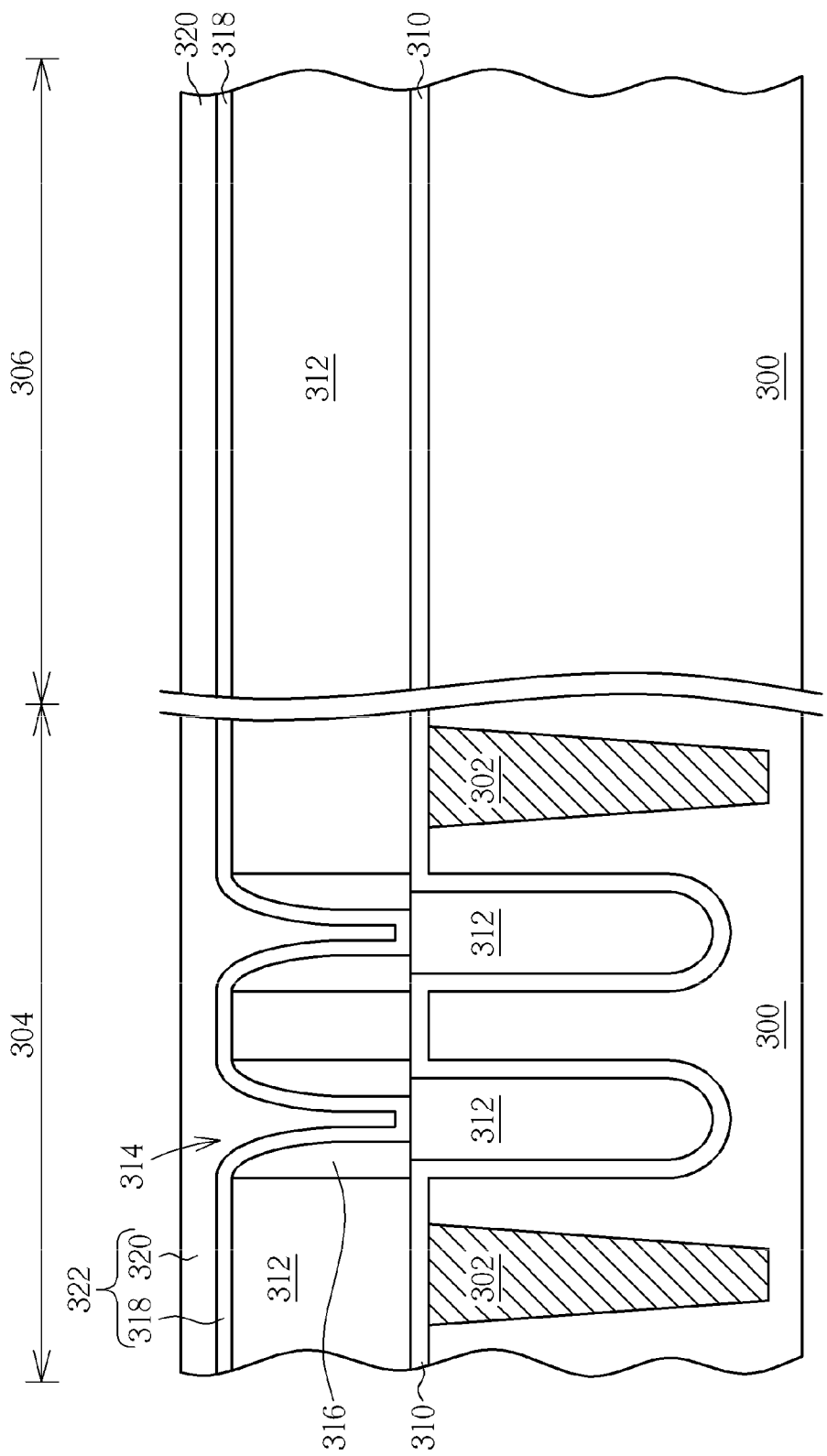

As shown in FIG. 6, a second conductive layer 322 is formed to fill into the second trench 314. In one embodiment, the second conductive layer 322 includes a barrier layer 318 and a metal layer 320. The barrier layer 318 is formed conformally on the curved surface 317 of the spacer 316 and directly contacts the top surface area 313 of the first conductive layer 312. The barrier layer 318 may be a TiN layer, a TaN layer or their combination. Next, a metal layer 320 is formed on the substrate 300 to completely fill the second trench 314. The metal layer 320 is a low-resistance layer which may include, for example, gold, silver, copper, aluminum, tungsten, molybdenum, titanium, tantalum, or nitride thereof, or oxide thereof, or their alloy. In one preferred embodiment, the metal layer 320 includes tungsten which provides good electrical conductivity.

Figure 7:
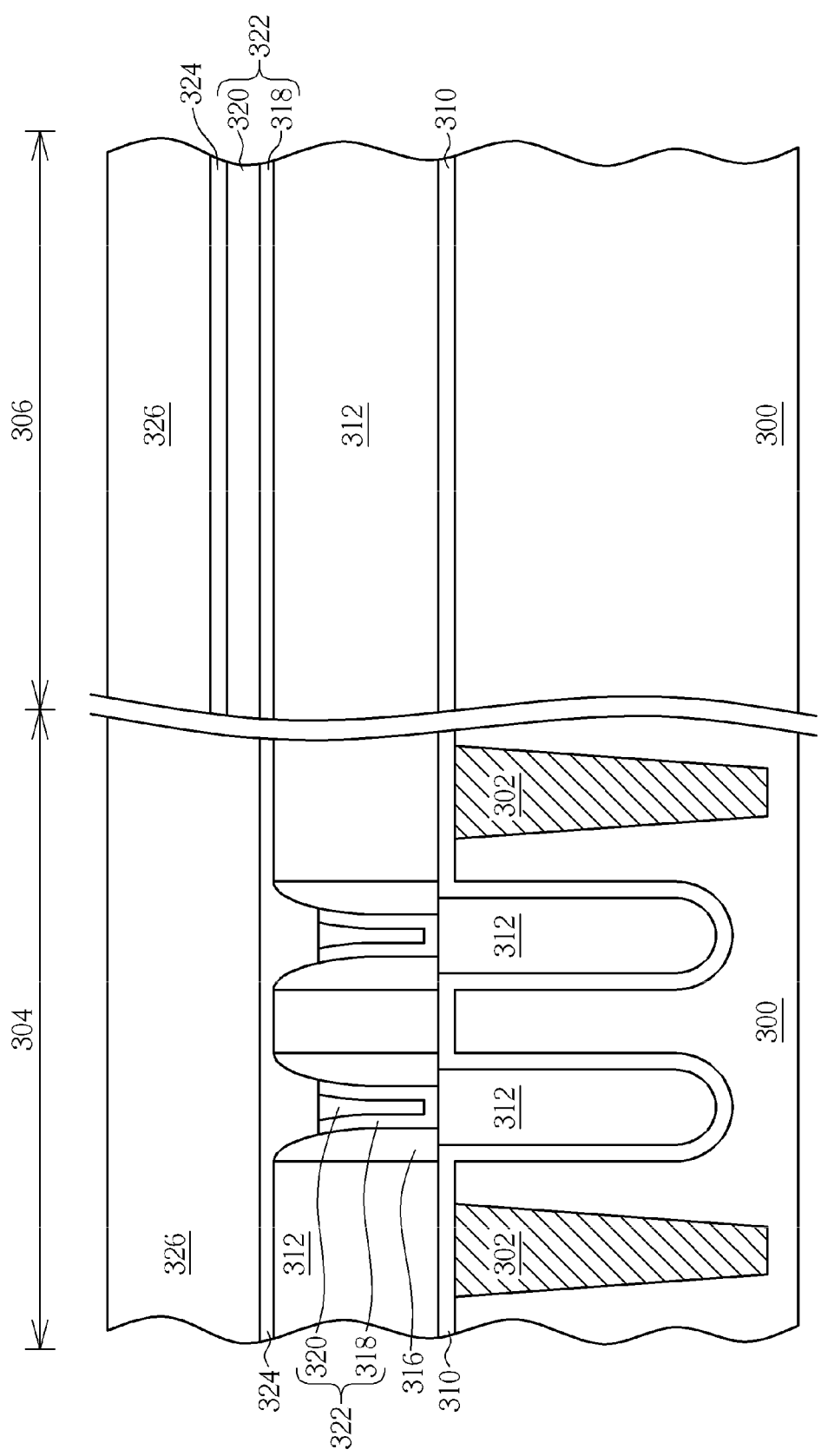

As shown in FIG. 7, an etching back process is performed to remove the second conductive layer 322 outside the second trench 314. In one preferred embodiment, a top portion of the second conductive layer 322 in the second trench 314 is further removed away. Next, a gate top oxide layer 324 such as a SiO$_2$ layer is formed on the substrate 300 to fill into the second trench 314. A mask layer 326 such as a SiN layer is then formed on the gate top oxide layer 324. In the peripheral region 306, since there is no first trench 308 and second trench 314 formed on the substrate 300, the mask layer 326, the gate top oxide layer 324, the metal layer 320, the barrier layer 318, the first conductive layer 312 and the gate dielectric layer 310 are now disposed in series on the substrate 300 and are ready to become a peripheral gate in the subsequent steps.

Figure 8:
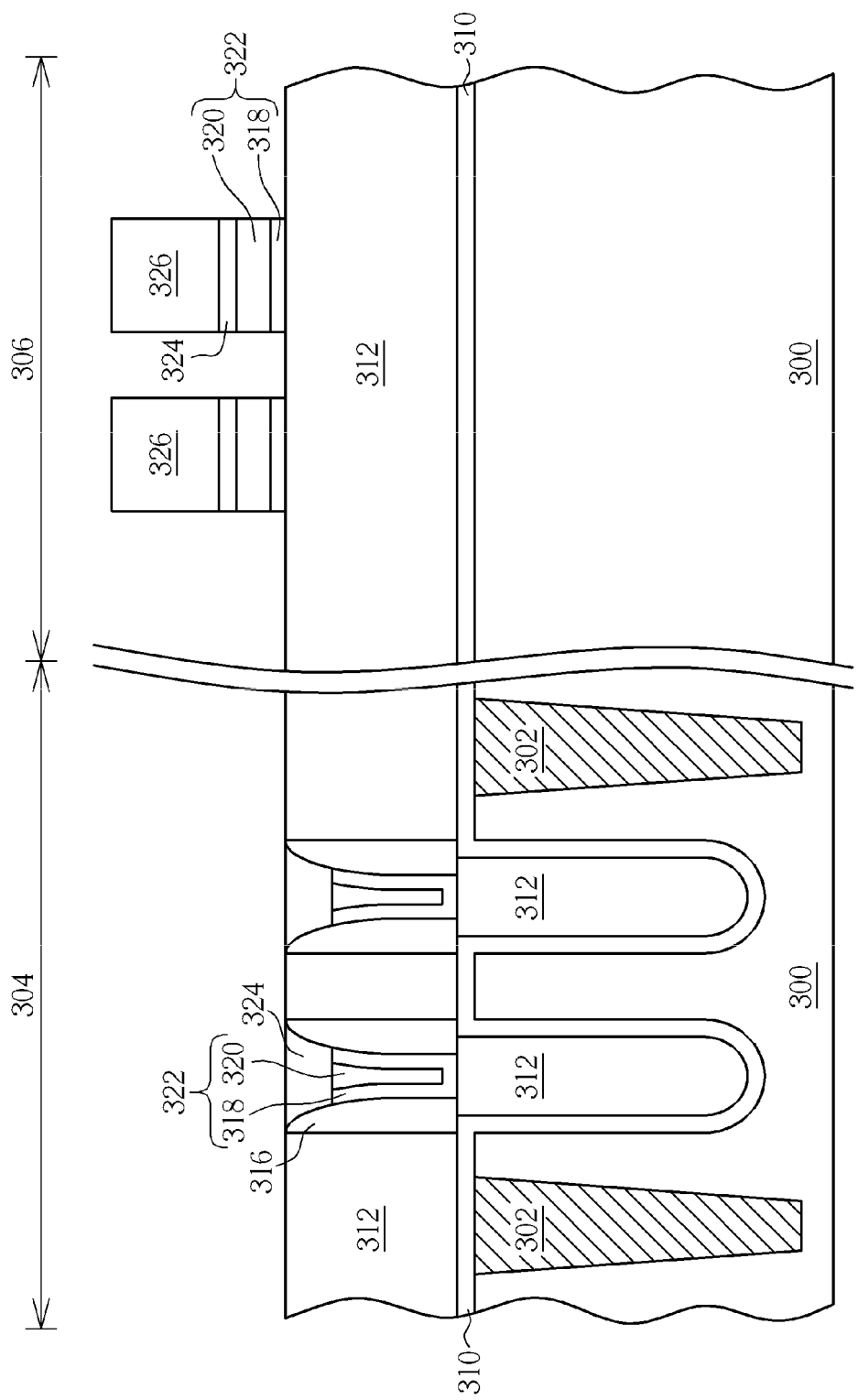

As shown in FIG. 8, the mask layer 326, the gate top oxide layer 324, the metal layer 320, the barrier layer 318 are patterned. In the peripheral region 306, these layers are patterned according to the layout of the peripheral gate. In the array region 304, these layers are removed away except the portions inside the second trench 314. That is, the second trench 314 is filled with the second conductive 322 and the gate top oxide layer 324. The gate top oxide layer 324 becomes a cap layer disposed on the second conductive layer 322.

Figure 9:
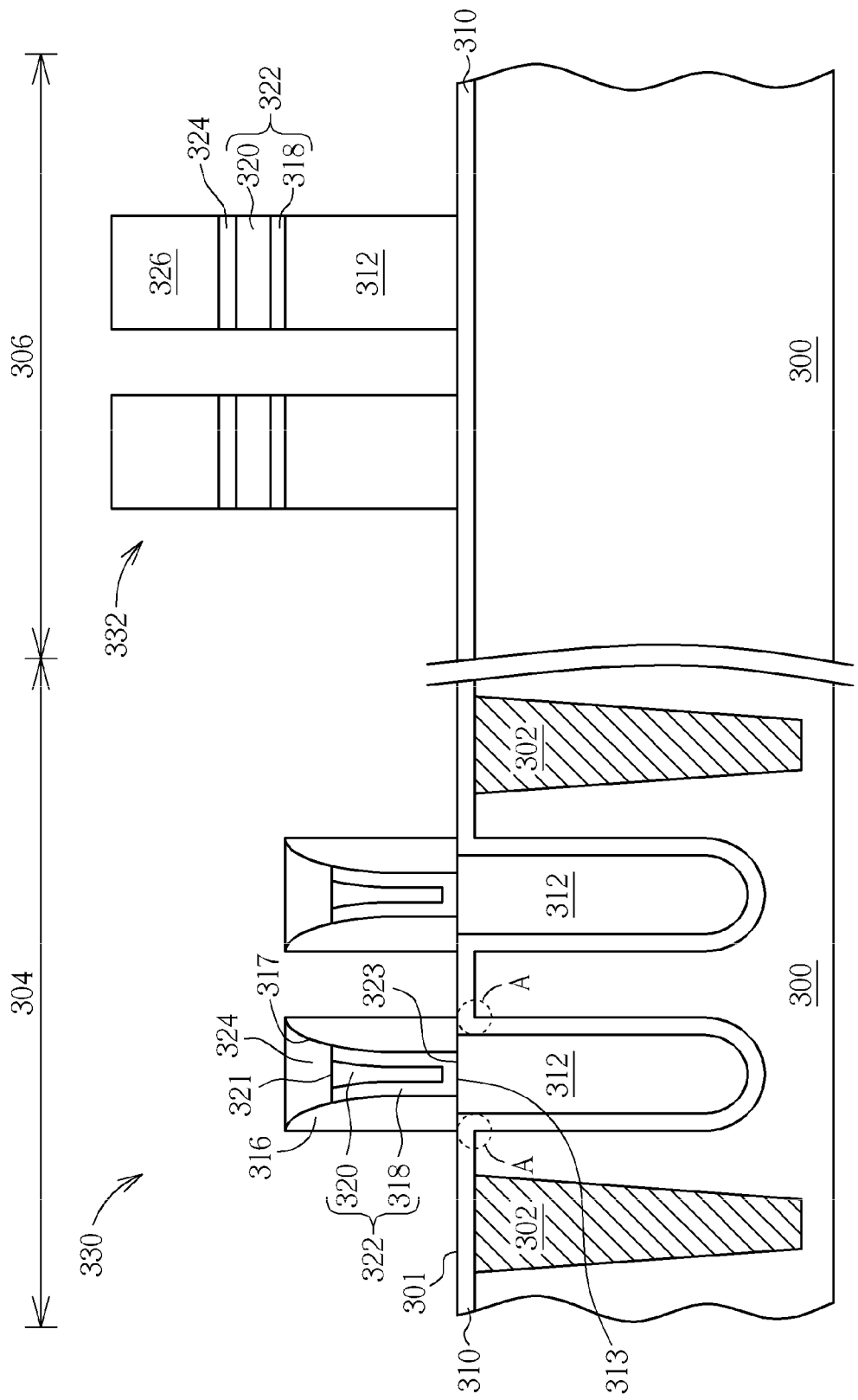

Next, as shown in FIG. 9, an etching process is performed to remove the first conductive layer 312 on the substrate 300. In the array region 304, the first conductive layer 312 outside the first trench 308 is removed away. Simultaneously, in the peripheral region 306, a part of the first conductive layer 312 is removed away by using the mask layer 326 as a mask. A slit gate recess channel 330 is now formed in the array region 304 and a peripheral gate 332 is now formed in the peripheral region 306. As shown in FIG. 9, in the array region 304, the first conductive layer 312 in the first trench 308 becomes the recess gate of the slit recess gate channel 330, and the second conductive layer 322 becomes the gate conductor (RC) of the slit recess gate channel 330. In the peripheral region 306, the first conductive layer 312 and the second conductive layer 322 together form a peripheral gate 332. Related semiconductor processes, such as dopant implanting process to form the source/drain region, can be carried out to in the subsequent steps. These processes are well known in the art and are not described in detail.

As shown in FIG. 9, the slit recess channel gate 330 in the array region 304 includes a substrate 300, a gate dielectric layer 310, a first conductive layer 312, a second conductive layer 322 and a spacer 316. A first trench 308 is disposed in the substrate 300. The gate dielectric layer 310 is disposed on a surface of the first trench 308, and the first conductive layer is embedded in the first trench 308. The second conductive layer 324 is disposed above the main surface 301 of the substrate 300 and is aligned with the first conductive layer 312. The spacer 316 is disposed on a sidewall surface of the second conductive layer 322 and encompasses the second conductive layer 322, forming an "inner spacer structure". The inner spacer 316 includes a curved surface 317 facing inwardly into the second conductive layer 322, thereby forming a tapered structure shrinking from bottom to top. The second conductive layer 322 has a corresponding tapered structure relative to the spacer 316, that is, the second conductive layer 322 is shrinking from a top surface area 321 to a bottom surface area 323. The bottom surface area 321 of the second conductive layer 322 is smaller than the top surface area 323 of the second conductive layer 322.

Since the second conductive layer 322 is formed on the curved surface 317 of the spacer 316 correspondingly, the second conductive layer 322 can precisely align with the first conductive layer 312 by controlling the thickness of the spacer 316, for example, by adjusting the parameters in the deposition step and/or the etching step of forming the spacer 316. As shown in FIG. 9, the spacer 316 can ensure the second conductive layer 322 being directly contacting the first conductive layer 312 because the bottom surface area 323 of the second conductive layer 322 is smaller than the top surface area 313 of the first conductive layer 312, making the alignment between the first conductive layer 312 and the second conductive layer 322 easier. Moreover, because the bottom surface area 323 of the second conductive layer 322 is small and is away from corner A, which has high e-field in the substrate 300, the slit recess channel gate 300 in the present invention may decrease the phenomenon of gate-induced drain leakage (GIDL) conventionally caused by high e-field in corner A. Further, the second conductive layer 322 is preferably made of metal, so even when the bottom surface area 323 of the second conductive layer 322 is small, the electrical conductivity would not be seriously affected.

In summary, the present invention provides a slit recess channel gate and the method of forming the same. The second conductive layer (the gate conductor) and the spacer, both of which include tapered structures, are proposed in the present invention to ameliorate conventional recess gate which has serious misalignment problem between the recess gate (the first conductive layer) and the gate conductor (the second conductive layer). Moreover, when forming the slit recess channel gate in the array region, the peripheral gate can be formed simultaneously in the peripheral region, thereby streamlining the fabricating method.

Those skilled in the art will readily observe that numerous modifications and alterations of the device and method may be made while retaining the teachings of the invention.

What is claimed is:

1. A method of forming a slit recess channel gate, comprising:
   providing a substrate having an array region and a peripheral region;
   forming a first trench in the array region;
   forming a gate dielectric layer and a first conductive layer on the substrate to at least fill the first trench;
   forming a second trench in the first conductive layer in the array region, wherein the second trench is aligned with the first trench;
   forming a spacer on a sidewall of the second trench;
   forming a barrier layer conformally in the second trench; and
   forming a metal layer on the barrier layer to at least fill the second trench.

2. The method of forming a slit recess channel gate according to claim 1, wherein after forming the second conductive layer, a bottom surface area of the second conductive layer is substantially smaller than a top surface area of the second conductive layer.

3. The method of forming a slit recess channel gate according to claim 1, wherein after forming the second conductive layer, a bottom surface area of the second conductive layer is substantially smaller than a top surface area of the first conductive layer.

4. The method of forming a slit recess channel gate according to claim 1, wherein the step of forming the spacer comprises a dry etching step.

5. The method of forming a slit recess channel gate according to claim 1, further comprising:
   removing a top portion of the second conductive layer in the second trench; and
   forming a cap layer to at least fill the second trench.

6. The method of forming a slit recess channel gate according to claim 1, further comprising: removing the first conductive layer outside the first trench in the array region.

7. The method of forming a slit recess channel gate according to claim 6, wherein when removing the first conductive layer in the array region, simultaneously patterning the first conductive layer in the peripheral region.

8. The method of forming a slit recess channel gate according to claim 1, wherein the peripheral region is masked when forming the first trench and the second trench.

9. The method of forming a slit recess channel gate according to claim 1, wherein the first conductive layer comprises poly-silicon.

10. The method of forming a slit recess channel gate according to claim 1, wherein the barrier layer comprises TiN or TaN.

11. The method of forming a slit recess channel gate according to claim 1, wherein the metal layer comprises W.

* * * * *